United States Patent [19]
Rogers

[11] 3,749,937
[45] July 31, 1973

[54] ELECTRICAL DIVIDING CIRCUITS

[75] Inventor: Michael John Rogers, Bishop's Cleeve, Near Cheltenham, England

[73] Assignee: Smiths Industries Limited, London, England

[22] Filed: Nov. 23, 1971

[21] Appl. No.: 201,530

[30] Foreign Application Priority Data

Nov. 27, 1970 Great Britain .................. 56,378/70

[52] U.S. Cl. ......... 307/225 C, 307/223 C, 307/251, 307/255

[51] Int. Cl. .......................................... H03k 23/08

[58] Field of Search ........... 307/205, 221 C, 223 R, 307/223 C, 225 R, 225 C, 251, 255, 279

[56] References Cited

UNITED STATES PATENTS

| | | | |
|---|---|---|---|
| 3,267,295 | 8/1966 | Zuk | 307/205 |
| 3,500,062 | 3/1970 | Annis | 307/251 X |
| 3,548,203 | 12/1970 | Basse et al. | 307/223 X |
| 3,575,610 | 4/1971 | Okubo | 307/223 C |
| 3,593,032 | 7/1971 | Ma | 307/223 C X |
| 3,292,008 | 12/1966 | Rapp | 307/221 C X |

*Primary Examiner*—John S. Heyman
*Attorney*—William D. Hall, George Vande Sande et al.

[57] ABSTRACT

An electrical divider for dividing an alternating input signal by an odd integral factor N has N interconnected logic stages. Each stage has two inputs to which are applied the input signal to the divider and an output signal provided by an individual one of the other stages. Each stage includes first and second pairs of transistors arranged such that those of the first pair are biased conductive whenever the signals applied to the inputs concurrently attain a first voltage level, and those of the second pair are biased conductive whenever those voltages concurrently attain a second voltage level. When the transistors in the first or second pair of transistors are both biased conductive then the output of the stage is connected to a supply lead at the second or first voltage level respectively. In this arrangement, the output of each stage alternates at a frequency N times less than the frequency of the input signal.

One described embodiment shows a divider for dividing by a factor of three. The divider is formed from metal-oxide-semiconductor field effect transistor elements on a single semiconductor chip, the transistors of the first and second pairs of transistors being of complementary types.

5 Claims, 2 Drawing Figures

PATENTED JUL 31 1973 3,749,937

ELECTRICAL DIVIDING CIRCUITS

Figure 1:
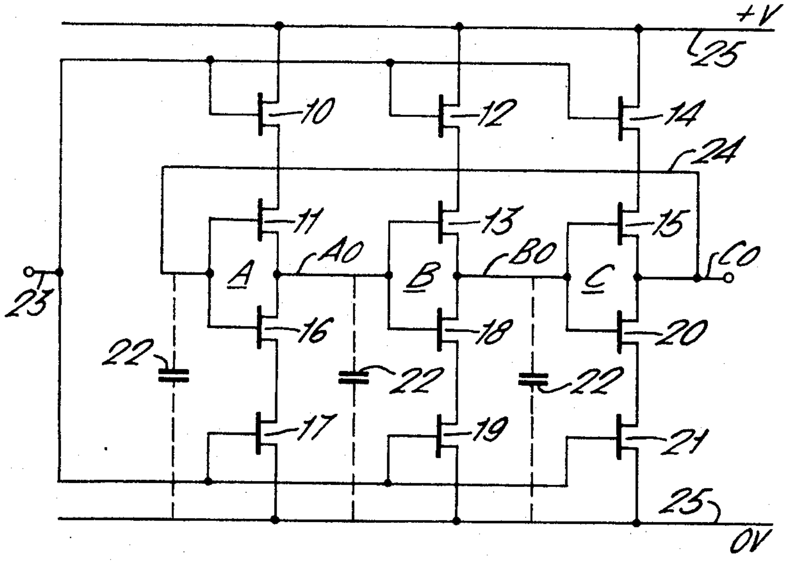

This invention relates to electrical dividers.

The invention is particularly though not exclusively, applicable to electrical dividers for use in battery-powered watches and clocks.

One form of electrical divider widely used at present in battery-powered watches comprises a bistable circuit. This form of divider provides an output signal having a pulse repetition frequency one half that of the signal applied to it, that is to say, it divides by a factor of two.

One disadvantage arising in use with bistable divider circuits is that they generally draw current continuously from their supply and this severly limits life of the battery provided in the watch. A further disadvantage arises with the more recent proposals to use a high-frequency oscillator as the signal source. If a chain of bistable circuits were required to divide an alternating signal having a pulse repetition frequency of 1MHz down to a pulse repetition frequency of $1H_Z$ then as many as twenty separate bistable circuits would be required in the chain.

Objects of the invention include the provision of circuits which alleviate the above disadvantages.

According to the invention there is provided an electrical divider for dividing an alternating input signal by a factor N where N is an odd integer greater than unity, comprising N interconnected switching stages each one of which has a pair of inputs and includes a switching circuit that is arranged to derive an output voltage signal having one or the other of two predetermined voltage levels in dependence upon voltages applied to its inputs, the switching circuit being arranged to switch the output voltage signal to said one voltage level whenever the input voltages attain first predetermined voltage levels concurrently and to said other voltage level whenever the input voltages attain second predetermined voltage levels concurrently, and wherein each said stage has one of its two inputs connected to receive the output signal of an individual one of the other stages and its other input connected to receive the said alternating input signal applied to the divider.

One advantage that dividers in accordance with the present invention have over conventional bistable dividers is that each stage of the present dividers draws current from the supply only when changing its output voltage level. That is to say the current consumption of dividers in accordance with the present invention is essentially discontinuous.

Another advantage results from the ability of the dividers in accordance with the present invention to divide by a factor greater than two. It can be shown that the current consumption for any given divider is proportional to the product CVF where C represents the capacitance of the divider which is charged and discharged during each cycle of the input signal, V is the divider operating voltage and F is the frequency of the input signal. Thus for a series connected chain of similar dividers the total current consumption tends to a theoretical limit proportional to the expression $CV(F + F/N + F/N \cdot N + F/N \cdot N \cdot N \ldots)$, or $CVFN/(N-1)$ where $N$ is the factor by which each divider divides the signal applied to it. For a chain of bistable dividers this theoretical limit is defined by 2CVF, whereas for a chain of divide-by three dividers in accordance with the present invention the corresponding theoretical limit is defined by 1.5CVF.

A further disadvantage of the present arrangements which include a chain of bistable dividers is that these arrangements require additional checking or monitoring circuitry to ensure their correct operation. This requirement increases the current consumption of these arrangements to a level defined by 7 or 8 CVF.

It will be seen that merely to change the division ratio of each divider from two to three therefore reduces the theoretical limit of current consumption of a chain of dividers by a factor of 25 percent and that in practice even greater reductions in current consumption may be obtained. Further savings in current consumption may be achieved by using dividers which divide by even greater factors.

A divide-by-three circuit in accordance with the invention will now be described, by way of example, with reference to the accompanying drawing in which:

FIG. 1 is a circuit diagram of the divide-by-three circuit; and

Figure 2:
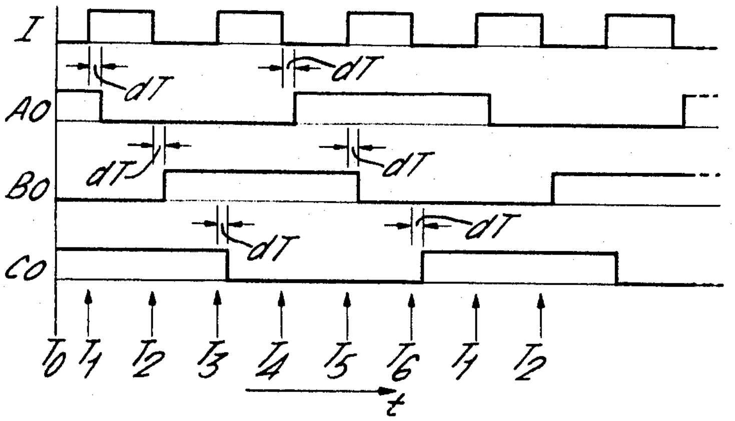

FIG. 2 indicates operational voltage changes in the circuit of FIG. 1.

Referring to FIG. 1, the circuit includes twelve metaloxide semiconductor transistors 10 to 21, formed on a single substrate chip. Six of the transistors, those referenced 10 to 15, are *p*-type whilst the others, referenced 16 to 21, are *n*-type. The circuit comprises three separate stages A, B and C which include respectively the four transistors 10, 11, 16 and 17, the four transistors 12, 13, 18 and 19, and the four transistors 14, 15, 20 and 21, and which have associated values of intrinsic capacitance represented by the capacitors 22.

The input signal to the divider is applied to an input terminal 23 and from there is applied as a first input voltage to each of the stages, being applied in stage A to the gate electrodes of transistors 10 and 17, in B to the gate electrodes of the transistors 12 and 19, and in stage C to the gate electrodes of transistors 14 and 21. The three stages A, B and C provide output voltage signals at Ao, Bo and Co respectively and these are applied as second input voltages to the stages B, C and A. Thus the output signal of stage A at Ao, is applied to the gate electrodes of transistors 13 and 18 in stage B, the output signal of stage B at Bo, is applied to the gate electrodes of transistors 15 and 20 in stage C, and the output signal of the final stage, at Co is applied via connection 24 to the gate electrodes of transistors 11 and 16 in the first stage A. The output from the divider as a whole is taken in the present case from Co but, as will be seen, may be taken alternatively from Ao or Bo.

The voltage waveforms appearing at Ao, Bo and Co in consequence of the application of a regularly recurring voltage pulse train I, are shown in FIG. 2 and operation of the divider will be described with reference to FIGS. 1 and 2 and to the following Table.

The voltages appearing at the input 23 and at Ao, Bo and Co through successive stable stages 1 to 6 are each indicated in the Table by V or O, according to whether a positive or a zero voltage level obtains.

| State | Input 23 | Ao | Bo | Co |
|---|---|---|---|---|
| 1 | O | V | O | V |
| 2 | V | O | O | V |
| 3 | O | O | V | V |
| 4 | V | O | V | O |
| 5 | O | V | V | O |
| 6 | V | V | O | O |

In the following description state 1 is assumed to be the "initial condition" which the divider adopts when connected across the voltage supply leads 25. As the operation of the circuit is such that all possible states 1 to 6 are achieved within one complete cycle of operation it will be appreciated that any other may be the starting point in practice. If, when the circuit is connected across the voltage supply leads 25, it adopts a state not shown in the Table, for example with a voltage V at each of Ao, Bo and Co, the condition of the divider will be unstable and there will be immediate degeneration from this into one of the six stable states shown.

The initial condition shown in the Table corresponds to the instant To in FIG. 2. As indicated, the input signal at the input terminal 23 is at or near zero potential, as is Bo, both Ao and Co are at a positive potential equal to, or just less than the supply potential V. In this state transistors 10, 12, 14, 15, 16 and 20 are biased ON whilst the other six transistors are held OFF. The potentials appearing at Ao, Bo and Co are held at the levels indicated in the Table by the action of the capacitances 22. The leading edge of the next positive going pulse of the input signal at T1 in FIG. 2, will bias transistors 10, 12 and 14 OFF and transistors 17, 19 and 21 ON. Thus transistors 16 and 17 will be biased ON together and after a time interval dT, which is a function of the charge of the capacitance 22, the potential at Ao will fall. The change is potential at Ao biases transistors 13 and 18 ON and OFF respectively, however the potential at Bo will not rise as transistors 12 and 19 are respectively biased OFF and ON.

When the potential of the input signal next falls to zero, at T2 in FIG. 2, transistors 10, 12 and 14 are biased ON and transistors 17, 19 and 21 are biased OFF. Thus both the transistors 12 and 13 are ON together and after a delay, *dT*, the potential at Bo will rise to the positive supply potential + V. The rise in potential at the gates of transistors 15 and 20 will bias them OFF and ON respectively but the potential at Co will not fall to zero as transistor 21 is biased OFF. The next positive pulse, beginning at T3, will bias transistors 10, 12 and 14 OFF and transistors 17, 19 and 21 ON, and transistors 21 and 21 will be biased ON together, after the delay dT the potential at Co will therefore fall to zero and this fall in potential acts to bias transistors 11 and 16 ON and OFF respectively. At the end of this positive input pulse, T4 in FIG. 2, transistors 10 and 11 will be concurrently biased ON and the potential at Ao will rise to the supply potential. Transistors 13 and 18 are now biased OFF and ON respectively and the next positive going leading edge, at T5 in FIG. 2, will cause the potential at the Bo to fall to zero. This fall in potential will bias transistors 15 and 20 On and OFF respectively and condition the final stage C to change its output voltage at Co to a positive level at the end of this input pulse, T6 in FIG. 2. At this point the divider will have completed one complete cycle of operation and the output voltage signals at Ao, Bo and Co will have each provided one complete pulse.

The output signal of the divider taken from Co is at one-third of the frequency of the pulsed voltage signal applied to the input terminal 23.

It will be noted that each stage switches its output signal to a potential dependent upon the levels of the signals applied to it. In the example chosen each stage A, B and C provides respectively a low potential output signal if Co, Ao or Bo is high and the input signal is high simultaneously. The output signals provided by each stage can in one sense therefore be regarded as the logical complement or inverse of the addition of the input signals applied to the stage (normally if the inputs were both high then the output-for a logical addition-would also be high). When the inputs to the stages are low, then the output signals provided by them, as inverse logical additions, are high. It will also be noted that the output signal provided by each stage changes its voltage level only when the inputs to the stage become simultaneously high or simultaneously low. As such, the divider described may take many alternative forms provided the logical functions just described are achieved. However, we have discovered that the circuit in the present example, formed in complementary metal-oxide-semi-conductor field-effect-transistors provides a surprisingly convenient way of providing the logic functions required for in a divider according to the invention.

Using the above techniques, we have already provided dividers having division-ratios of 5, 7 and even 9 with some extra gating. For division-ratios of 9 and higher odd numbers, the dividing technique above remains as defined in the specification. However, the attractions of using circuits providing higher division ratio diminish in practice with further increase of the division-ratio due to the extra input power required to drive the additional stages and any extra gating which may be required and the increased practical difficulty found at the present time of laying-down the more complex circuits required on single chip.

I claim:

1. An electrical divider circuit for dividing the frequency of an applied alternating input signal by a number N where N is an odd integer greater than unity, comprising: N stages each having first and second inptus, an output and switching means responsive to the voltage levels of signals applied to the said first and second inputs to switch said output selectively between first and second predetermined voltage levels, said switching circuit comprising means operative to switch the said output to the said first voltage level only when the voltages applied to the said first and second inputs attain the said second voltage level concurrently and means to switch the output to the said second voltage level only when the signals applied to the said first and second inputs attain the said first voltage level concurrently; supply means to apply the said alternating input signal to the said first inputs of all said N stages concurrently, said supply means comprising means operative to apply the said alternating input signal to each said first input irrespective of the voltage level at the output of any of said N stages; and connection means connecting the said N stages together in cascade to form a closed ring, said connection means comprising means applying to the second input of each stage the voltage level at the output of the preceding stage in the ring, whereby the said output of each individual stage is switched to said first or second voltage levels only when the output of the preceding stage and the alternating input signal are both at said second or first voltage level respectively.

2. An electrical divider as claimed in claim 1 in which the switching circuit of each said stage comprises two complementary transistor switching means each of which includes a pair of transistors, one transistor of each pair having a control electrode connected to the said first input of the stage and to the other transistor of the pair having a control electrode connected to the said second input of the stage, the two transistors of a first and said pairs being responsive to the voltage levels at said first and second inputs to both conduct only when said first and second inputs attain said first voltage level, and the two transistors of the second of said pairs being responsive to the voltage level at said first and second inputs to both conduct only when said first and second inputs concurrently attain said second voltage level.

3. An electrical divider as claimed in claim 2 in which said transistors are field-effect transistor devices.

4. An electrical divider circuit for dividing the frequency of an applied alternating signal by a number N where N is an odd integer greater than unity comprising: N identical stages, each stage having first and second inputs, an output, a first and a second direct-current electrical-supply terminal, and first and second arms connected between the output and the said first and said second supply terminals respectively the said first arm comprising a first pair of transistor devices of the same, first conductivity type each having a control electrode for controlling the conductivity of said path, and means coupling the first pair of transistor devices together with their current-carrying paths connected in series with one another between the output and the first said supply terminal, and the said second arm comprising a second pair of transistor devices of the same, second conductivity type, each having a current-carrying path and a control electrode for controlling the conductivity of said path, and means coupling the second pair of transistor devices together with their current-carrying paths in series wth one another between the output and the second said supply terminal, each said stage further including means coupling the control electrodes of one of the transistor devices in each arm to the said first input and means coupling the control electrodes of the other of the transistor devices in each arm to the said second input; supply means to apply the alternating input signal to the said first inputs of all said N stages concurrently, said supply means being operative to apply said alternating input signal to each said first input irrespective of the voltage level at the output of any of said N stages; and connection means connecting the said N stages together in cascade to form a closed ring, said connection means comprising means applying to the second input of each stage the voltage level at the output to the preceding stage in the ring, whereby each of the two transistors of said first arm in each stage conducts only when the alternating input signal and the output voltage of the preceding stage in the ring are both at the voltage level of the said second supply terminal and each of the two transistors of said second arm in each stage conducts only when the alternating input signal and the output voltage of the preceding stage in the ring are both at the voltage level of the said first supply terminal.

5. An electrical divider circuit for dividing the frequency of an alternating voltage by a number N where N is an odd integer greater than unity comprising: a pair of direct-current supply terminals; an input terminal to receive said alternating voltage; N stages each comprising an output, a first pair of transistor devices of a first conductivity type each having a current-carrying path and a control electrode for controlling the conductivity of that path, means connecting the current-carrying paths of the first pair of transistor devices in series with one another across a first of said supply terminals and said output, a second pair of transistor devices of a second conductivity type each having a current-carrying path and a control electrode for controlling the conductivity of that path, means connecting the current-carrying paths of the second pair of transistor devices in series with one another directly across the second of said supply terminals and said output, a direct-current interconnection interconnecting the control electrode of one transistor device of said first pair and the control electrode of one transistor device of said second pair, and means connecting the control electrode of the other transistor device of said first pair and the control electrode of the other transistor device of said second pair in common with one another to said input terminal; and means connecting all the N stages together in a closed ring, said means comprising means connecting the output of each individual stage to the said direct-current interconnection of the next succeeding stage in said ring.

* * * * *